US007661962B2

(12) United States Patent
Kanesashi (10) Patent No.: US 7,661,962 B2
(45) Date of Patent: Feb. 16, 2010

(54) SOCKET FOR ELECTRIC COMPONENT (75) Inventor: Hokuto Kanesashi, Saitama (JP)

(73) Assignee: Enplas Corporation, Kawaguchi-shi (JP)

( * ) Notice: Subject to any disclaimer, the term of this patent is extended or adjusted under 35 U.S.C. 154(b) by 0 days.

(21) Appl. No.: 12/115,606

(22) Filed: May 6, 2008

(65) Prior Publication Data

US 2008/0278919 A1    Nov. 13, 2008

(30) Foreign Application Priority Data

May 8, 2007    (JP)    ............... 2007-123858

(51) Int. Cl.
    H01R 12/00    (2006.01)
(52) U.S. Cl. ........................ 439/70; 439/331
(58) Field of Classification Search ............ 439/70,
    439/71, 331, 330, 263, 259, 266, 268, 265
    See application file for complete search history.

(56) References Cited

U.S. PATENT DOCUMENTS 5,364,286 A * 11/1994 Matsuoka ............... 439/331

6,500,017 B2 * 12/2002 Hayakawa ............... 439/268
6,749,443 B2 *  6/2004 Sano et al. ............... 439/71
2001/0055902 A1   12/2001 Hayakawa

FOREIGN PATENT DOCUMENTS

JP    2002-008809    1/2002

* cited by examiner

Primary Examiner—Felix O Figueroa
(74) Attorney, Agent, or Firm—Finnegan, Henderson, Farabow, Garrett & Dunner, L.L.P.

(57) ABSTRACT

A socket for an electric component may have a socket main body, a plurality of contact pins disposed within the socket main body, a socket cover, a slide plate disposed inside the socket main body to be movable up and down, and drive levers which are provided between the socket main body and the bottom face of the socket cover. The drive levers press both end portions of two opposing sides of the slide plate by a down-movement-operation of the socket cover to lower the slide plate. The socket may also include sub-levers provided between the socket main body and the bottom face of the socket cover for pressing one or plural positions of other opposing two sides of the slide plate, which oppose to each other in a direction perpendicular to the two opposing sides pressed by the drive levers to lower the slide plate.

1 Claim, 12 Drawing Sheets

SOCKET FOR ELECTRIC COMPONENT

BACKGROUND OF THE INVENTION

1. Field of the Invention

The present invention relates to a socket for an electric component, which is adapted for detachably accommodating an electric component such as an IC package or the like to connect the same to a circuit board, e.g., a printed circuit board, and more particularly to a socket for an electric component, which is provided with a plurality of contact pins arranged in a socket main body and a slide plate for permitting each of the plurality of contact pins to be brought into contact with or separated apart from each of connection terminals of the electric component through displacement of the contact pins, and is capable of reducing an amount of deformation of the slide plate for equalizing the amount of movement of the slide plate.

2. Description of the Related Art

Figure 11:
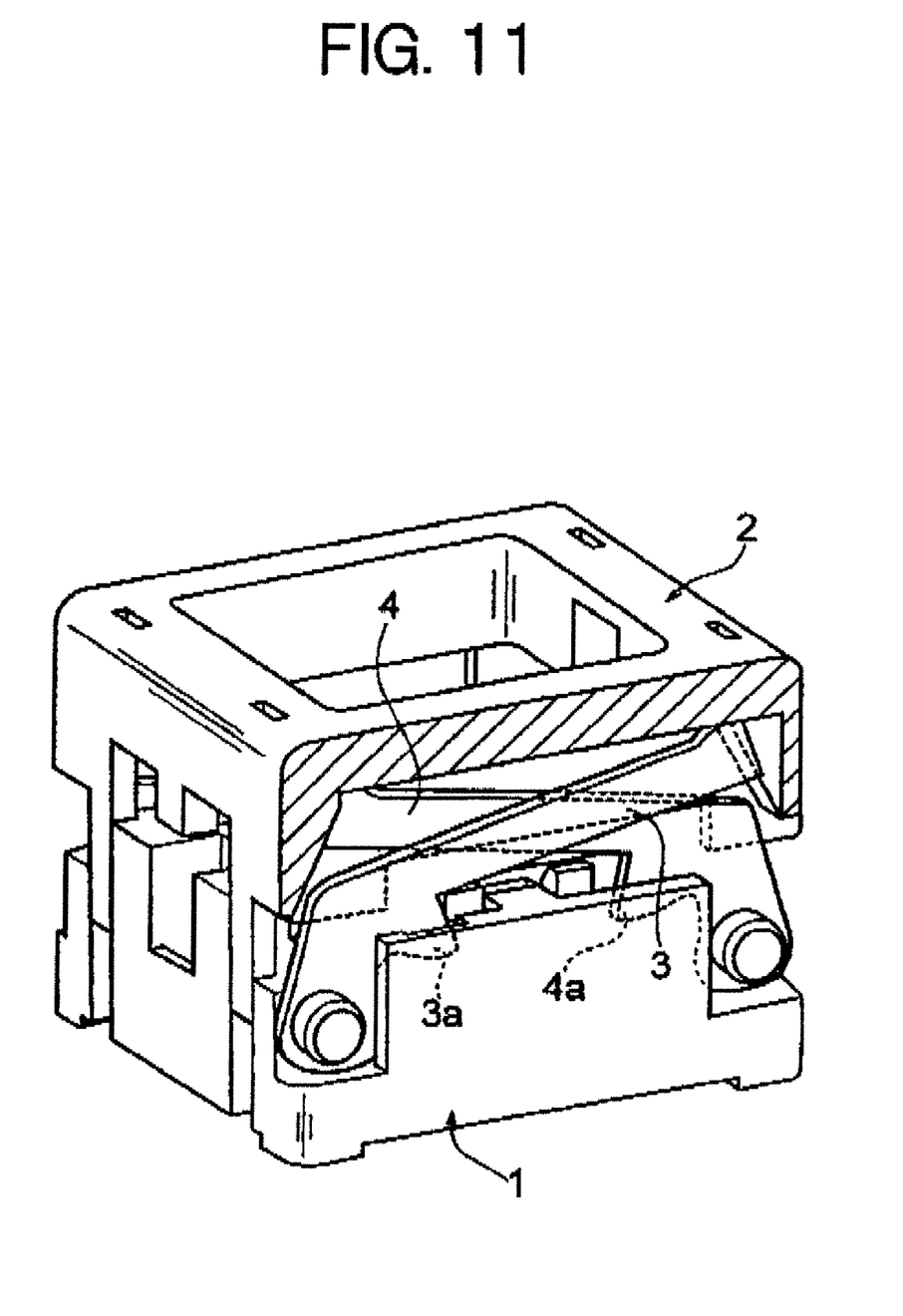
FIG. 11 is a partially sectional perspective view showing a conventional socket for an electric component.

Conventionally, this type of the socket for an electric component, in particular, an open-top-type socket includes therein, as shown in FIG. 11, a socket main body 1 having an accommodating portion for accommodating an electric component, a plurality of contact pins (not seen in FIG. 11 because disposed inside the socket main body 1) which are mounted in the socket main body 1 and connectable to/separable from connection terminals of the electric component, a socket cover 2 mounted on the top of the socket main body 1 movably in a vertical direction, a slide plate (not seen in FIG. 11 because disposed inside the socket main body 1) which is vertically movably disposed within the socket main body 1 so as to displace the contact pins, so that the contact pins come in contact with/disconnect from the connection terminals of the electric component, and drive levers 3, 4 which are provided between the socket main body 1 and the bottom face of the socket cover 2 to press both end portions of two opposing sides of the slide plate when the socket cover 2 is lowered, thereby lowering the slide plate. In the meantime, the drive levers 3, 4 are provided in a pair on each of the opposing two sides of the socket main body 1, whereby two pairs of the levers are provided.

The IC package as an electric component has a number of solder balls projecting from the bottom face of the package main body to be used as connection terminals such that the solder balls are arranged in a matrix configuration In a vertical direction and a transversal direction. The slide plate is formed into, for example, a rectangular shape in its plan view and a contact pin is inserted into each of a number of pin holes bored in a substantially entire surface excluding the peripheral region and then, when this slide plate is moved vertically, i.e., up and down, each contact pin is urged to do displacement from its original position.

When the IC package is accommodated in the socket main body 1 and connected to the socket for an electric component, the socket cover 2 mounted on the top of the socket main body 1 is vertically moved to rotate the drive levers 3, 4 pivoted on the inner wall portion of the socket main body 1. Pressing portions 3a, 4a provided on the intermediate portion of the drive levers 3, 4 press the slide plate to move the slide plate vertically, so that the contact pins are urged to make displacement by the vertical motion of the slide plate in order to resultantly open/close the contact portion at the tip end of each contact pin thereby bringing it into contact with the connection terminal of the electric component (see, for example, Japanese Laid-open (Kokai) Patent Application Publication No. 2002-8809).

Figure 12:
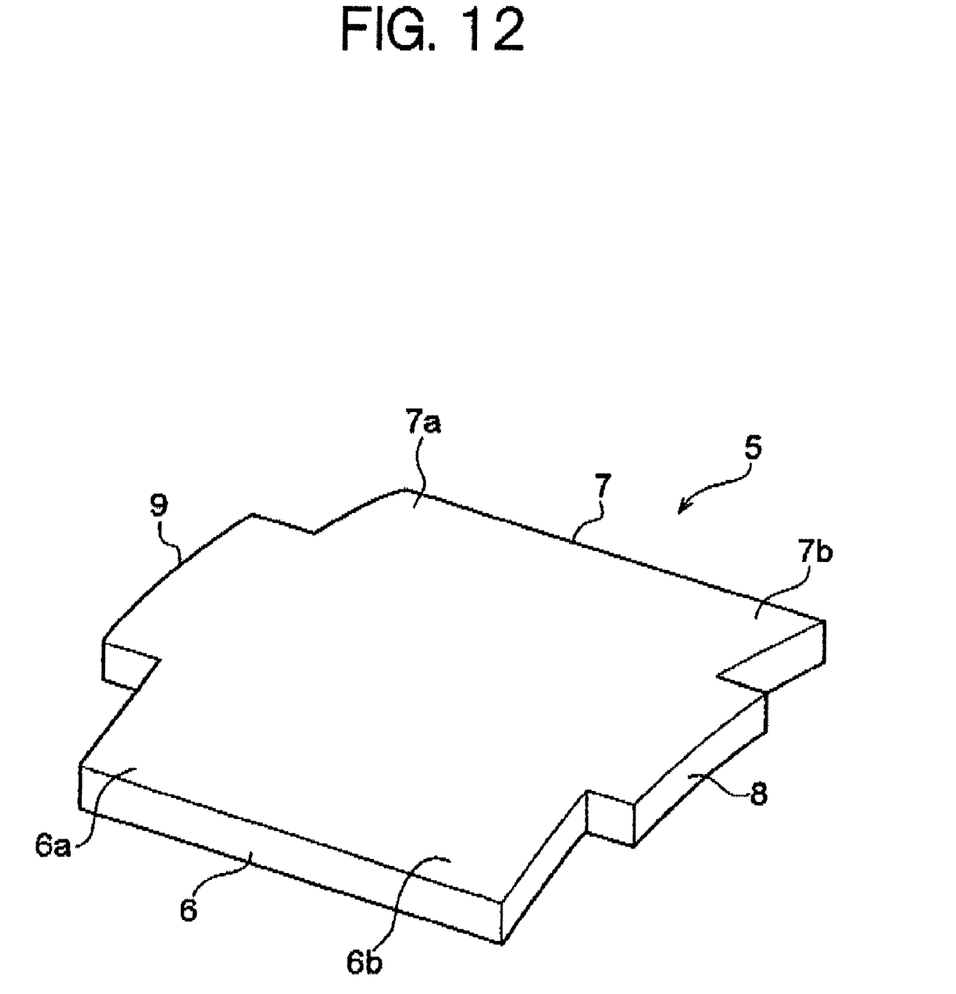
FIG. 12 is a perspective view showing a state in which the slide plate is deformed.

However, because in the conventional socket for an electric component, as shown in FIG. 12, the slide plate 5 that is rectangular in its plan view is lowered by pressing both end portions 6a, 6b; 7a, 7b of opposing two sides 6, 7 thereof, the descent amount of, particularly, a central portion of other opposing two sides 8, 9 not pressed directly by the drive levers 3, 4 must be relatively small, so that the slide plate 5 is often deformed in a curved manner with that portion having the form of a ridge. This is because the slide plate 5 receives a resistance against the descent thereof, due to sliding contact of the number of contact pins inserted in substantially the entire surface of the slide plate 5 with the same slide plate 5.

If the slide plate 5 is deformed in this way, the moving distance thereof in the vertical direction becomes unequal between the opposing two sides 6, 7 and the central portion therebetween, so that the contact portions at the tip ends of the contact pins disposed at the central portion of the slide plate 5 fail to be sufficiently opened, thereby often causing a contact failure between the contact pin and the connection terminal of the electric component. In addition, in recent years, the IC package is highly integrated and as the number of the connection terminals on the bottom face of the package main body has been increased, the number of the contact pins is also increased, thereby presenting multiple pin configuration trend. In this case, as the contact pins are formed into the multiple pin configuration, the resistance against the above-mentioned descent due to sliding contact of the slide plate 5 with the contact pins is increased so as to increase the deformation of the slide plate 5 and therefore, a contact failure occurs between the contact pin and the connection terminal of the electric component. Accordingly, the conventional socket for an electric component cannot often cope with the multiple pin configuration trend of the contact pin.

SUMMARY OF THE INVENTION

An object of the present invention is to solve the above-described problem by providing a socket for an electric component which is able to positively reduce an amount of deformation of its slide plate that is provided for causing each of plural contact pins arranged inside the socket main body thereof to do a displacement for coming into contact with or separating apart from each of connection terminals of the electric component so that the amount of movement of the slide plate is entirely equalized.

To achieve the above object, in accordance with the present invention, there is provided a socket for an electric component, which includes: a socket main body having an accommodating portion therein for accommodating an electric component; a plurality of contact pins disposed in the socket main body and capable of coming in contact with or separating from each of connection terminals of the electric component; a socket cover mounted on a top of the socket main body to be capable of performing an up and down movement; a slide plate vertically movably disposed in the socket main body to cause a displacement of the contact pins thereby permitting the contact pins to come into contact with or separate apart from each of the contact terminals of the electric component; and drive levers which are provided between the socket main body and a bottom face of the socket cover and configured to press both end portions on two opposing sides of the slide plate in response to the down movement of the socket cover to lower the slide plate, wherein sub-levers are provided between the socket main body and the bottom face of the socket cover to press one or plural positions of other opposing two sides of the slide plate to thereby lower the slide plate.

With the above-described structure, in addition to the drive levers for lowering or descending the slide plate by pressing both end portions on opposing two sides of the slide plate by the operation of the socket cover for causing its down movement, the sub-levers are provided between the socket main body and the bottom face of the socket cover in order to press one position or plural positions of the other opposing two sides of the slide plate to lower the slide plate, thereby surely reducing the amount of deformation of the slide plate. Consequently, the amounts of movements of the side portions and the central portion of the slide plate can be always equalized to prevent occurrence of a contact failure between a contact portion at the tip end of each of the contact pins disposed in the central portion of the slide plate and a corresponding connection terminal portion of the electric component. Further, because the amount of movement of the respective side portions and that of the central portion of the slide plate can be equalized, the present invention can cope with the multiple pin trend of the contact pins of the socket for an electric component.

The sub-levers are disposed to press the central portion of the side plate in which the deformation of the opposing two sides of the slide plate different from both end portions of the slide plate is larger than that of the latter portions. Consequently, the sub-levers provided for pressing a central portion of the other opposing two sides in which the deformation of the other opposing two sides of the slide plate becomes larger than that of the both end portions of the other opposing two sides press the position suffering from a large deformation of the other opposing two sides of the slide plate to lower the slide plate, thereby reducing an amount of the deformation of the slide plate. Thus, the amounts of the movements of the side portion and the central portion of the slide plate can be equalized to prevent occurrence of a contact failure between the contact portion at the tip end of the contact pins and the connection terminals of the electric component.

Further, the sub-levers are so constructed to press the other opposing two sides of the slide plate when the amount of deformation of the slide plate becomes larger than a predetermined amount after an instant when the drive levers come to press the opposing two sides of the slide plate. As a result, when the amount of deformation of the slide plate becomes larger than the predetermined amount after the drive levers press the opposing two sides of the slide plate, the sub-levers for pressing the other opposing two sides of the slide plate press the portion in which deformation of the other opposing two sides of the slide plate is large with a time lag with respect to an operation of the drive levers so as to lower the slide plate, thereby reducing the amount of deformation of the slide plate. Therefore, while the deformation of the slide plate is small, the opposing two sides of the slide plate are pressed and lowered by only the drive levers and, when the deformation of the slide plate becomes larger than the predetermined one, the sub-levers press the portion in which the deformation of the other opposing two sides of the slide plate is large so as to lower the slide plate, so that the deformation can be reduced depending on a state how the deformation of the slide plate grows from an initial flat condition.

Further, the lever motion ratio exhibited by the drive lever to lower the slide plate in response to a downward-movement-operation of the socket cover is set larger than the lever motion ratio exhibited by the sub-lever to lower the slide plate in response to the downward-movement operation of the socket cover. Consequently, operating force at an initial period of operation of lowering the slide plate is reduced by the drive lever capable of exhibiting the lever motion ratio which is larger than the lever motion ratio exhibited by the sub-lever to lower the slide plate in response to the downward movement operation of the socket cover. Additionally, when the amount of the deformation of the slide plate becomes larger than the predetermined one, the sub-levers participate in pressing of the slide plate, so that the slide plate may be smoothly lowered.

BRIEF DESCRIPTION OF THE DRAWINGS

FIGS. 3A, 3B are explanatory diagrams showing an IC package as an electric component, wherein FIG. 3A is a front view thereof and FIG. 3B is a bottom view thereof;

FIGS. 4A, 4B are enlarged explanatory diagrams showing a contact pin, wherein FIG. 4A is a front view thereof and FIG. 4B is a right side view thereof;

FIGS. 5A, 5B, 5C are enlarged explanatory diagrams of major portions showing the operation of the contact pin by vertical motion of the slide plate, wherein FIG. 5A shows a state in which the contact portion at the tip end of the contact pin is closed, FIG. 5B shows a state in which the contact portion is opened and FIG. 5C shows a state in which solder balls of the IC package are nipped by the contact portion;

FIGS. 6A, 6B are enlarged explanatory diagrams of major portions showing the base portion of the socket main body, wherein FIG. 6A is a plan view thereof and FIG. 6B is a front sectional view thereof;

DESCRIPTION OF THE PREFERRED EMBODIMENTS

Hereinafter, embodiments of the present invention will be described in detail with reference to the accompanying drawings.

Figure 1:
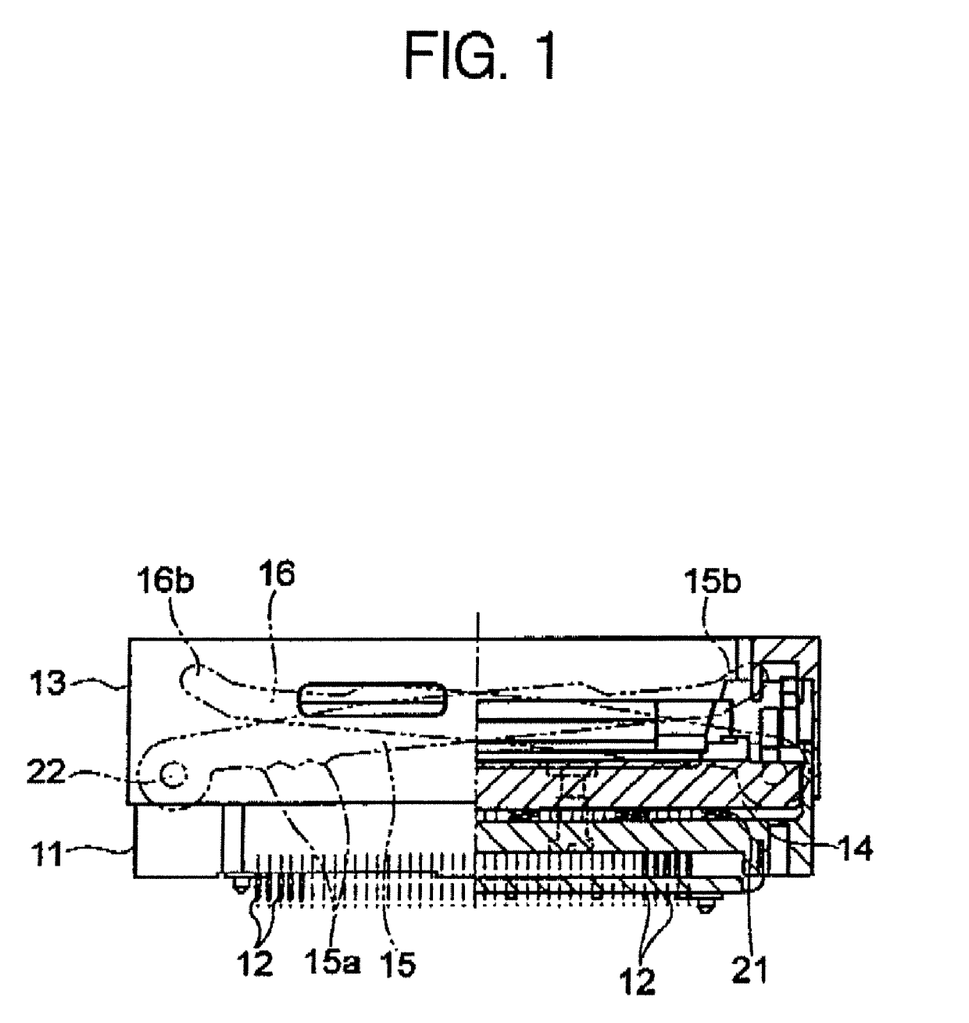
FIG. 1 is a front view of a right half section showing an embodiment of a socket for an electric component of the present invention.
Figure 2:
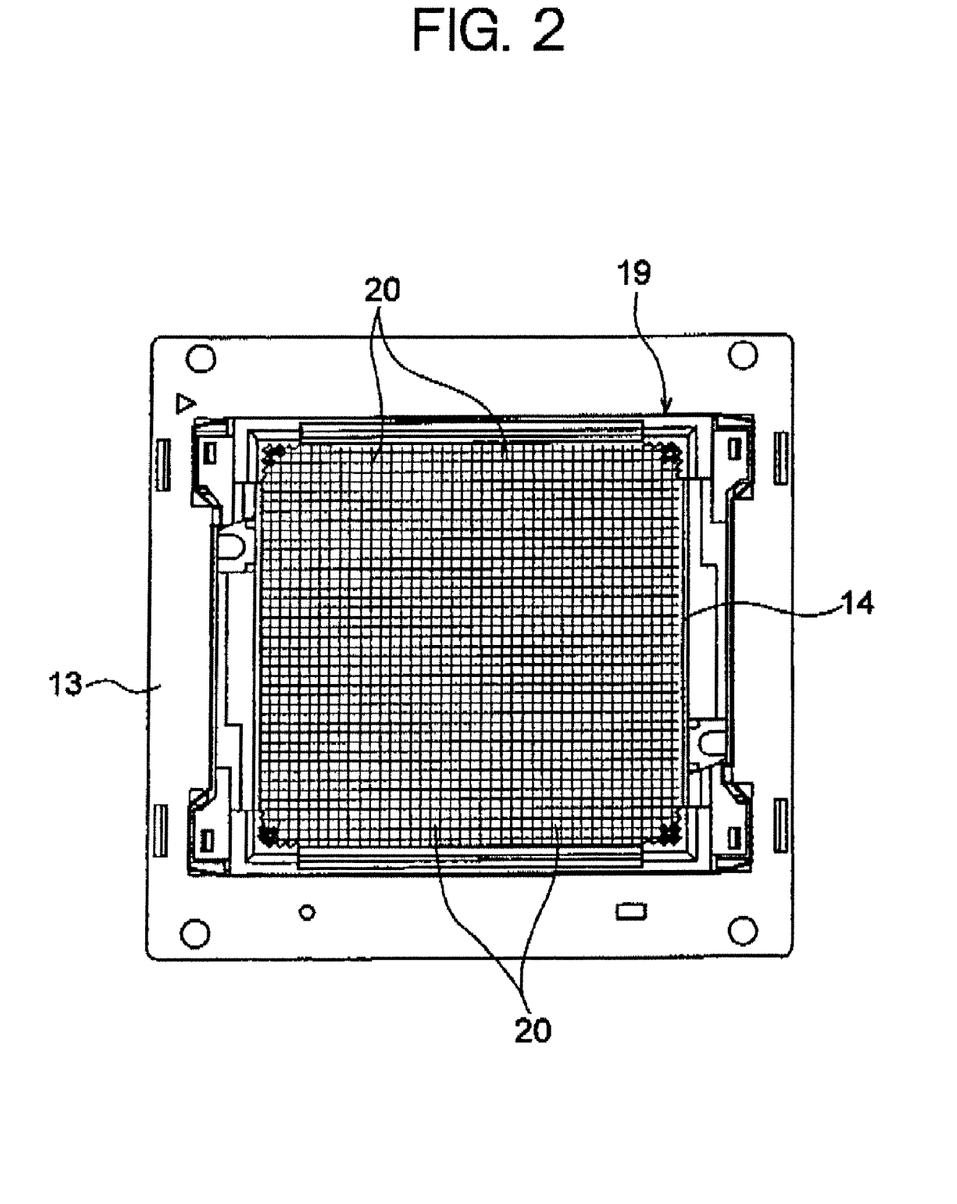
FIG. 2 is a plan view of FIG. 1.

FIG. 1 is a front view of a right half section showing an embodiment of the socket for an electric component of the present invention, and FIG. 2 is a plan view thereof. This socket for an electric component is adapted for detachably accommodating an electric component such as an IC package or the like to connect that electric component to a circuit board such as a printed wiring board and is, for example, an open-top-type socket, which includes therein a socket main body 11, a contact pin 12, a socket cover 13, a slide plate 14, drive levers 15, 16 and sub-levers 17, 18 (see FIG. 7).

Figure 3A:
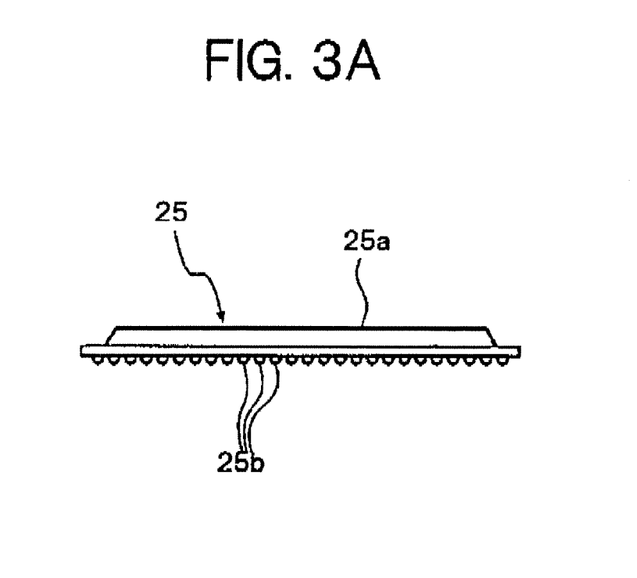
Figure 3B:
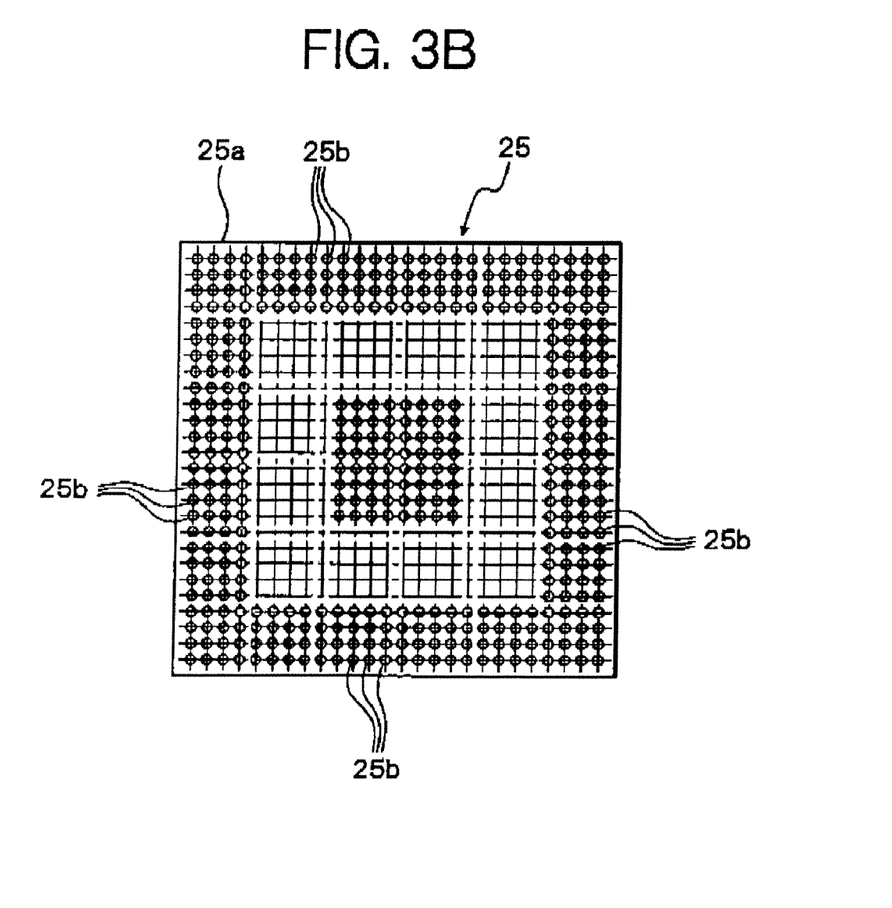

In an IC package 25 as an electric component, as shown in FIGS. 3A, 3B, a plurality of substantially spherical solder balls 25b as a connection terminal are projected from the bottom face of a rectangular package main body 25a in which a device such as an integrated circuit (IC) is sealed internally, the solder balls being arranged in a matrix shape in a vertical direction and a transversal direction.

The socket main body 11 serves for detachably accommodating the IC package 25 and positioning it, and includes an accommodating portion for accommodating the IC package 25 on its top face due to the conventionally known structure shown in FIG. 1. Then, this socket main body 11 includes therein a number of contact pins 12. This contact pin 12 electrically connects the solder ball 25b of the IC package 25 with a circuit board and is composed of an elongated sheet member having a conventionally known spring property and an excellent electrical conductivity. The contact portion at the tip end of the contact pin is opened/closed by the up or down movement of the slide plate 14 to be able to contact or separate apart from the solder ball 25b of the IC package 25.

Here, the contact pin 12 will be described in detail. This contact pin 12 is formed into a shape shown in FIGS. 4A, B and FIGS. 5A to 5C by being bent after a single conductive sheet material is punched out into a predetermined shape, and has a fixing portion 12e whose section in the horizontal direction is bent into a substantially U shape. A lead portion 12a is extended downward from this fixing portion 12e and a pair of elastic pieces 12b are extended upward. The contact pin 12 is inserted into a through hole 11d (see FIG. 6B) in the socket main body 11 and a pin hole 20 in the slide plate 14, and the fixing portion 12e is accommodated in an accommodating portion 11f provided on the bottom end side of the base portion 11a of the socket main body 11 from downward and supported by being covered from downward by a pressing plate 11g so that it is fixed to the socket main body 11. A top end 12h of the fixing portion 12e of the contact pin 12 keeps a contact with a contact portion 11k at the top end of the accommodating portion 11f of the socket main body 11.

In this embodiment, the contact pin 12 is substantially fixed by the accommodating portion 11f in the socket main body 11 and the pressing plate 11g, as mentioned above. However, because sometimes a slight clearance is generated in a space formed by the accommodating portion 11f and the pressing plate 11g, secure fixing of the contact pin 12 of the present invention to the socket main body 11 is achieved when a projecting portion 12f (see FIGS. 4A, B) of the contact pin 12 bites into a biting portion 11h (see FIGS. 6A, B) formed within the through hole 11d in the socket main body 11, as described later.

Figure 5A:
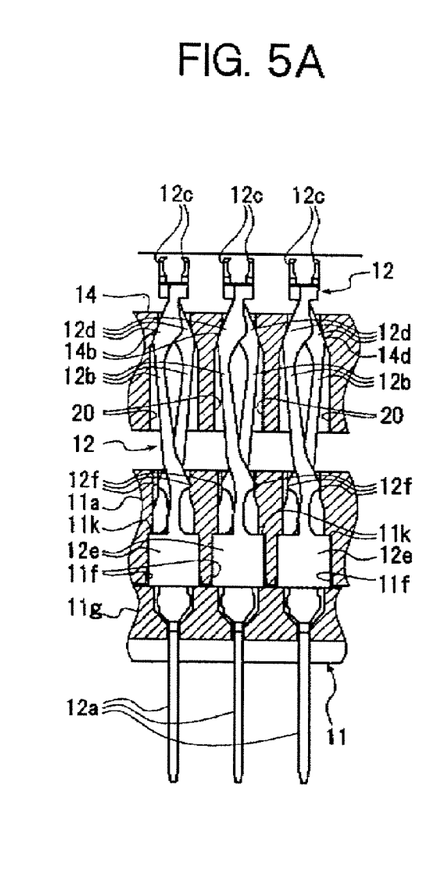
Figure 5B:
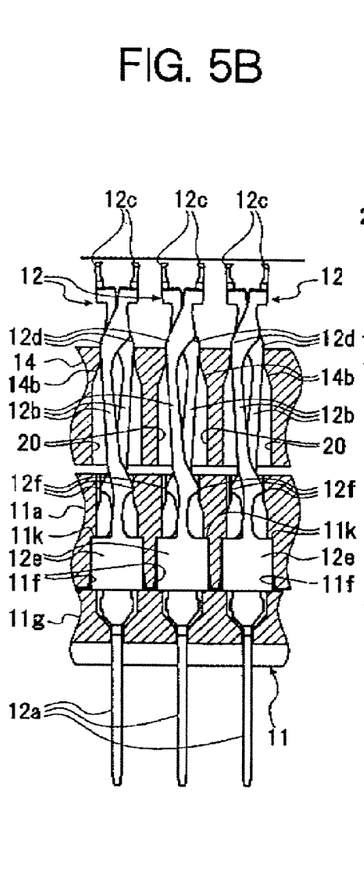
Figure 5C:
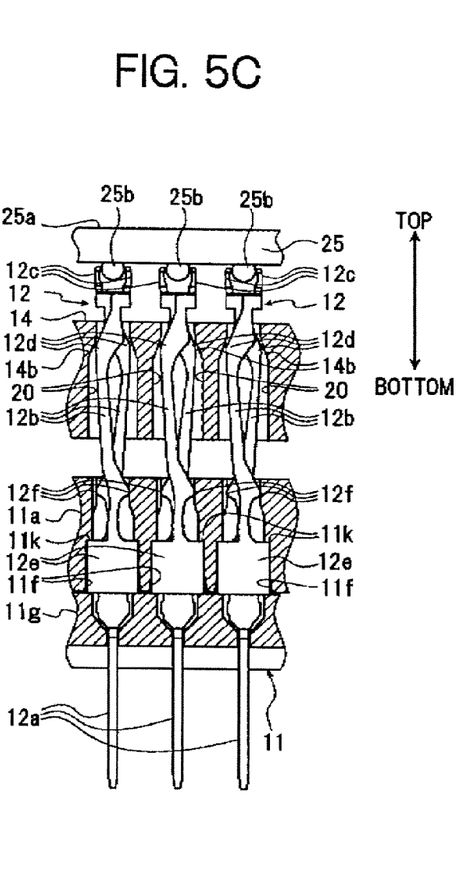

The lead portion 12a of the contact pin 12 is elastically deformable and as shown in FIGS. 5A to 5C, it is projected downward from the base portion 11a of the socket main body 11, inserted into the circuit board and soldered so that it is electrically connected to an electrode (not shown).

Figure 4A:
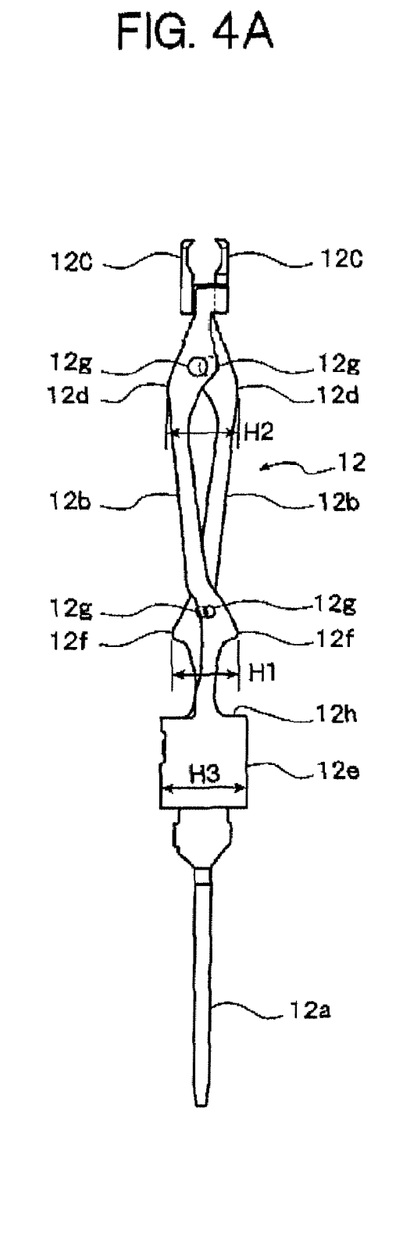

A pair of elastic pieces 12b of the contact pin 12 are formed such that their sheet faces in the direction of the sheet width oppose each other and are extended to the side of the slide plate 14 disposed on the top of the base portion 11a of the socket main body 11. A contact portion 12c which makes contact with the solder ball 25b of the IC package 25 is formed on the top end portion of the pair of the elastic pieces 12b. In the meantime, the contact portions 12c are bent so that their tip end portions are directed to each other as shown in FIG. 4A. These elastic pieces 12b in pair are pressed when the slide plate 14 is moved vertically so that the elastic pieces 12b are deformed elastically in a direction of approaching or leaving each other and consequently, the contact portions 12c at the top end portion are opened/closed so as to nip or release the solder balls 25b.

The respective elastic pieces 12b of the contact pin 12 are formed to be elastically deformable in a direction along the sheet face and have the projecting portions 12f which are projected along a sheet face in the sheet width direction so as to bite into the inner wall of the through hole 11d in the base portion 11a of the socket main body 11, the projecting portions 12f being provided in the vicinity of the fixing portion 12e. This projecting portion 12f bites into the inner wall of the through hole 11d due to the elastic force of the elastic piece 12b so as to apply a pressure thereto. That is, because when the pair of the projecting portions 12f press the inner wall of the through hole 11d in opposite directions to each other, they are pushed back by reaction forces, they are contracted relative to a width H1 between the tip ends of the projecting portions 12f shown in FIG. 4A. Then, because the projecting portions 12f press the inner wall of the through hole 11d of the socket main body 11 while biting into the same inner wall due to the elastic force of the projecting portions 12f, a movement in a vertical direction of the elastic piece 12b is securely restricted and the contact pin 12 is fixed to the socket main body 11. At the same time, the elastic pieces 12b are supplied with a pressure in a direction in which the contact portions 12c are closed (direction in which the contact portions 12c approach the solder ball 25b).

An actuating portion 12d which is projected in an opposite direction to the projecting portion 12f is provided in the vicinity of the contact portion 12c of each elastic piece 12b of the contact pin 12 in a direction along the sheet face. This actuating portion 12d is pressed against the inner wall of the pin hole 20 in the slide plate 14 to slide on the inner wall when the slide plate 14 is moved.

Figure 4B:
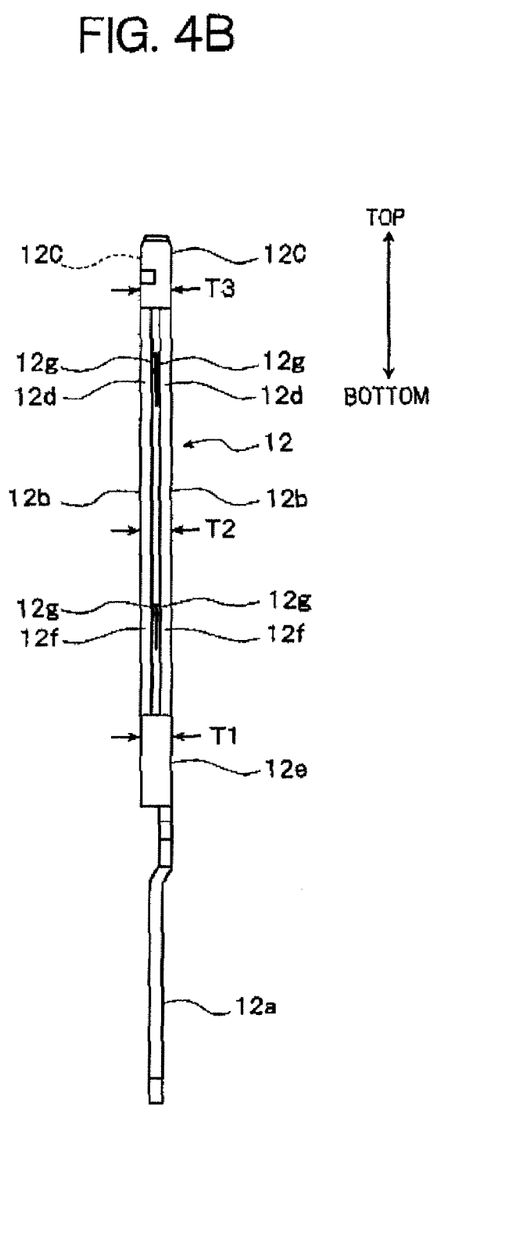

The projecting portion 12f and the actuating portion 12d are formed such that they are projected in opposite directions to each other between the pair of the elastic pieces 12b. Before they are mounted to the socket main body 11, that is, when they are not deformed elastically, as shown in FIGS. 4A, 4B, the width H1 between the tip ends of both the projecting portions 12f and the width H2 between the tip ends of both the actuating portions 12d are set smaller than the width H3 between the fixing portions 12e. That is, when they are deformed elastically, a width between the tip ends of the pair of the projecting portions 12f is contracted with respect to the width H1 when they are not deformed elastically. In the meantime, the contact portions 12c can apply a pressure to the solder ball 25b as long as a formation position of the projecting portion 12f is set between the fixing portion 12e and the contact portion 12c while it is not in close contact with the fixing portion 12e.

In the vicinity of the projecting portions 12f and the actuating portions 12d of the pair of the elastic pieces 12b of the contact pin 12, protrusions 12g are provided such that they are protruded in substantially the same length toward a mating elastic piece so that they make into a sliding contact. The protrusions 12g are formed into such a size which always allows them to make a sliding contact with each other when the pair of the elastic pieces 12b is operated. Then, in this contact pin 12, when the protrusions 12g keep sliding contact with each other, a thickness T1 of the fixing portion 12e substantially perpendicular to the sheet face, a thickness T2 in a direction perpendicular to the sheet face of the pair of the elastic pieces 12b disposed in parallel to each other and a thickness T3 of each contact portion 12c are set to substantially the same thickness.

Figure 6A:
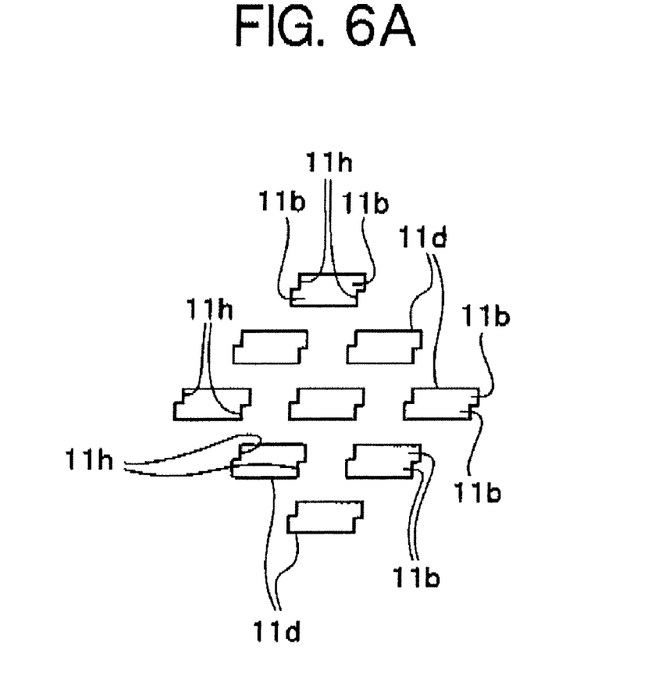
Figure 6B:
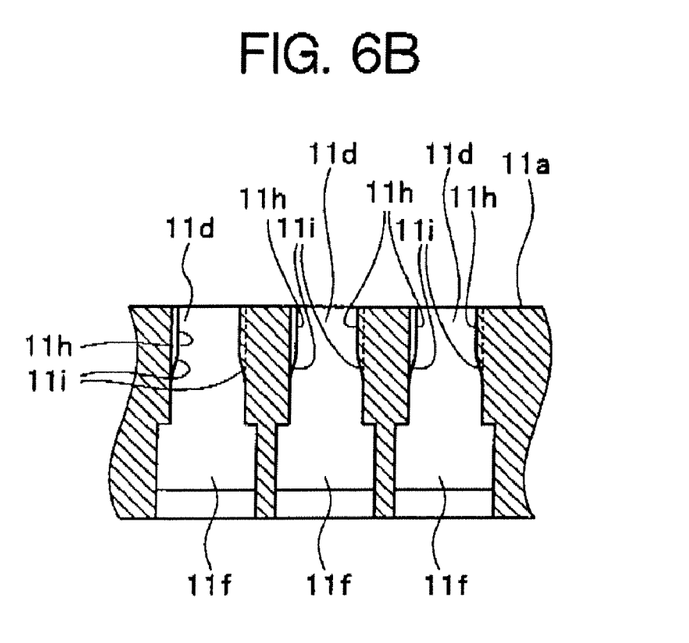

In the socket main body 11 in which the contact pins 12 are to be arranged, as shown in FIGS. 6A, 6B, a pair of elastic piece arrangement portions 11b, 11b, in which a pair of the elastic pieces 12b is to be passed through, is formed consecutively in each of a number of through holes 11d in the base portion 11a such that they extend upward from the accommodating portion 11*f* for accommodating the fixing portion 12*e* of each contact pin 12 shown in FIGS. 4A, 4B.

In each elastic piece arrangement portion 11*b*, 11*b* of the socket main body 11, the biting portion 11*h* into which the projecting portion 12*f* of the elastic piece 12*b* of the contact pin 12 is to bite is projected inward within the through hole and the biting portions 11*h* have guide faces 11*i* formed so that a distance between the wall faces is decreased gradually as it goes upward, as an inner wall face just below. When the contact pin 12 is inserted into and fixed in the socket main body 11, this biting portion 11*h* presses the projecting portion 12*f* inward by its projection amount inward so as to apply a pressure to the elastic piece 12*b* in a direction of closing the contact portion 12*c*. That is, when the biting portion 11*h* presses the projecting portion 12*f*, the width H1 between the tip ends of the projecting portions 12*f* is decreased so as to generate a pressure by an elastic force of the elastic piece 12*b*. Thus, the amount of projection inward and configuration of the biting portion 11*h* need to be set so that a desired pressure can be obtained.

The biting portion 11*h* of the socket main body 11 is formed such that it is extended upward from near and below a position in which the projecting portion 12*f* is located when the contact pin 12 is mounted in the socket main body 11. Consequently, when the contact pin 12 is mounted, the projecting portion 12*f* is pressed by the biting portion 11*h* so as to reduce a distance over which the contact pin 12 is slid.

As shown in FIG. 1, the socket cover 13 is mounted on the top of the socket main body 11 so that it can move vertically. This socket cover 13 serves as an operating member for nipping the solder ball 25*b* of the IC package 25 accommodated in the accommodating portion of the socket main body 11 by the contact portions 12*c* of the contact pin 12 to connect and fix the solder ball 25*b* thereto by the vertical movement. As shown in FIG. 2, the socket cover 13 has an opening portion 19 large enough for the IC package 25 to be inserted therein and the IC package 25 is inserted through this opening portion 19 from above and accommodated in the accommodating portion. In the meantime, the socket main body 11 and the socket cover 13 are formed of an insulating resin material.

The slide plate 14 is vertically movably disposed within the socket main body 11. This slide plate 14 moves vertically to displace the contact pin 12 so that the contact portion 12*c* at the tip end is brought into contact with or separated apart from the solder ball 25*b* of the IC package 25. As shown in FIG. 2, the slide plate 14 is formed into, for example, a rectangular shape in its plan view and a number of the pin holes 20 are provided in a substantially entire surface except the peripheral region. The contact pin 12 is inserted into each of the number of pin holes 20. In the meantime, as shown in FIG. 1, the slide plate 14 is urged upward by springs 21 placed on the bottom face. Then, the slide plate 14 is vertically movably disposed within the socket main body 11 and the socket cover 13 is vertically movably mounted on the top thereof.

The slide plate 14 will be described in detail. As shown in FIGS. 5A to 5C, the slide plate 14 to be mounted on the top of the base portion 11*a* of the socket main body 11 is formed into a sheet-like configuration, vertically movably disposed and urged upward by the springs 21. A plurality of the pin holes 20 are formed in this slide plate 14 corresponding to the plural contact pins 12 and a pair of the elastic pieces 12*b* (see FIGS. 4A, 4B) of the contact pin 12 are passed through each pin hole 20. The actuating portion 12*d* of this elastic piece 12*b* is configured to be pressed by the cam portion 14*b* formed on the inner wall of the pin hole 20. When the slide plate 14 is moved downward, the actuating portion 12*d* of the elastic piece 12*b* of the contact pin 12 is pressed by the cam portion 14*b* from a state shown in FIG. 5A to a state shown in FIG. 5B. Consequently, the pair of the elastic pieces 12*b* is elastically deformed so as to open the pair of the contact portions 12*c* at the tip end portion. When the slide plate 14 is moved upward by an urging force of the spring 21 with the IC package 25 shown in FIGS. 3A, 3B accommodated in the accommodating portion of the socket main body 11, as shown in FIG. 5C, the solder ball 25*b* of the IC package 25 is nipped between the pair of the contact portions 12*c* of the contact pin 12.

Figure 7:
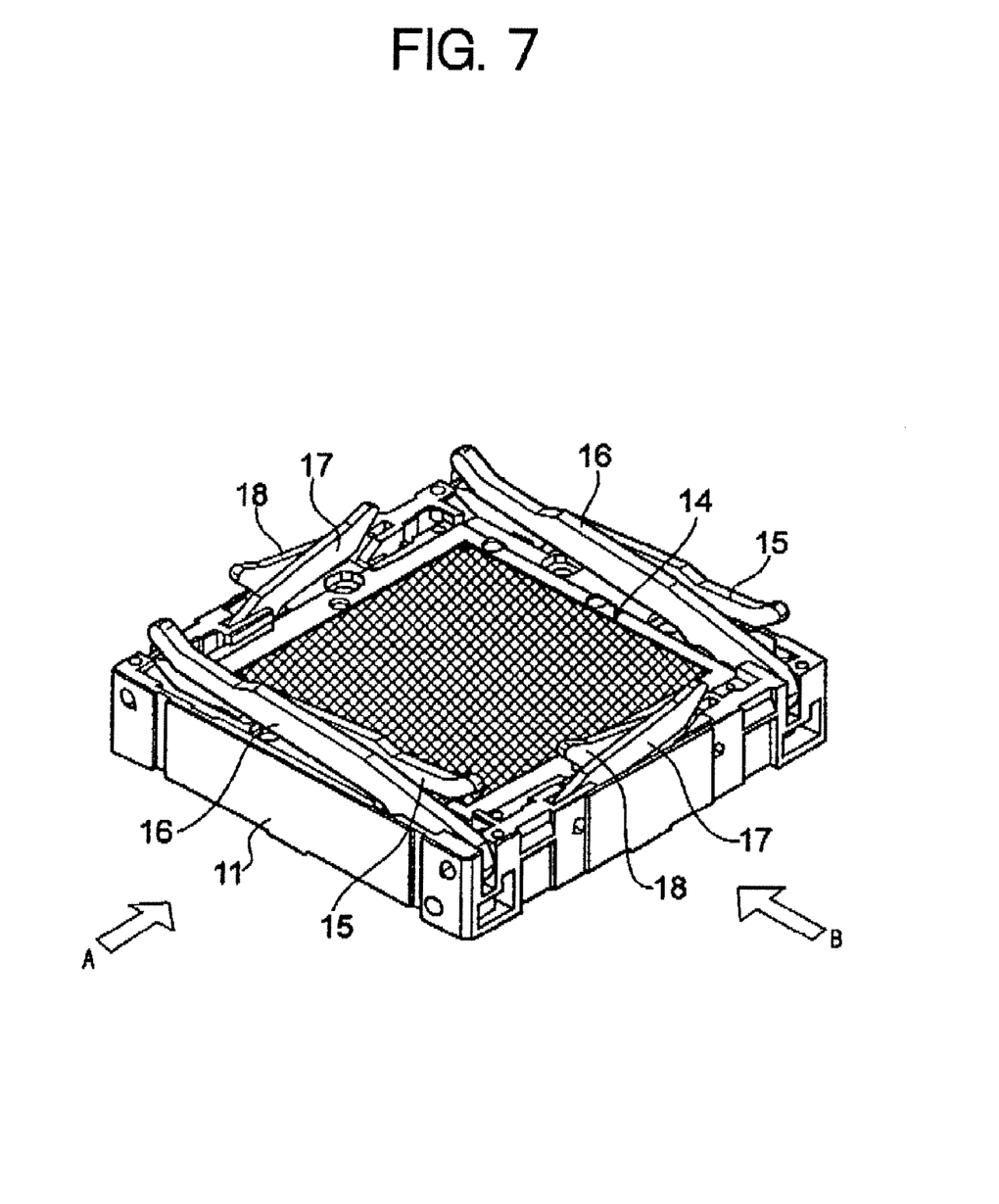
FIG. 7 is a perspective view showing a state in which the socket cover of the socket for an electric component of the present invention is removed.

As shown in FIG. 1, the drive levers 15, 16 are provided between the socket main body 11 and the bottom face of the socket cover 13. When the socket cover 13 is lowered, the drive levers 15, 16 press both end portions of opposing two sides (see reference numerals 6, 7 in FIG. 10) of the slide plate 14 so as to lower the slide plate 14, and the drive levers 15, 16 are formed of, for example, metal. As indicated in FIG. 7, which is a perspective view of a state in which the socket cover 13 is removed, each pair of the drive levers 15, 16 is provided on the opposing two sides of the socket main body 11, whereby totally two pairs are disposed.

Figure 8:
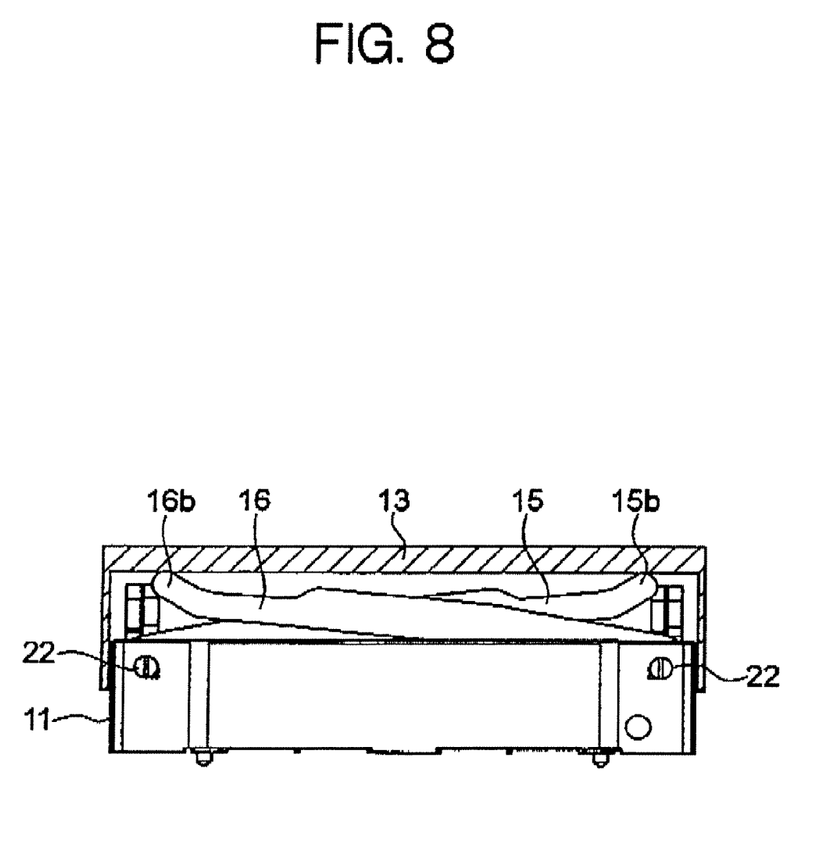
FIG. 8 is a partially sectional explanatory view taken from an arrow A in FIG. 7 showing a state in which the socket cover is attached.

The configuration and mounting structure of the drive levers 15, 16 will be described by taking the first drive lever 15 as an example. Referring to FIG. 1, the first drive lever 15 is formed into an elongated sheet shape extending in the width direction of the socket main body 11 and a pin 22 is inserted into a through hole bored in the proximal end portion so that the tip-end portion side of the lever is rotatable about this pin 22. Pressing portions 15*a* which project downward are provided on the bottom side face in the vicinity of the proximal end through which the pin 22 is passed so as to touch the top face of the slide plate 14 and as shown in FIG. 8, the contact portion 15*b* which makes contact with the bottom face of the socket cover 13 is formed at the tip end portion on an opposite side to the pin 22.

The second drive lever 16 is configured completely in the same manner while it is just exchanged with the first drive lever 15 with respect to their right and left positions. With this state, as shown in FIGS. 1 and 7, the first drive lever 15 and the second drive lever 16 are arranged in a substantially X shape as seen from the arrow A in FIG. 7.

Figure 10:
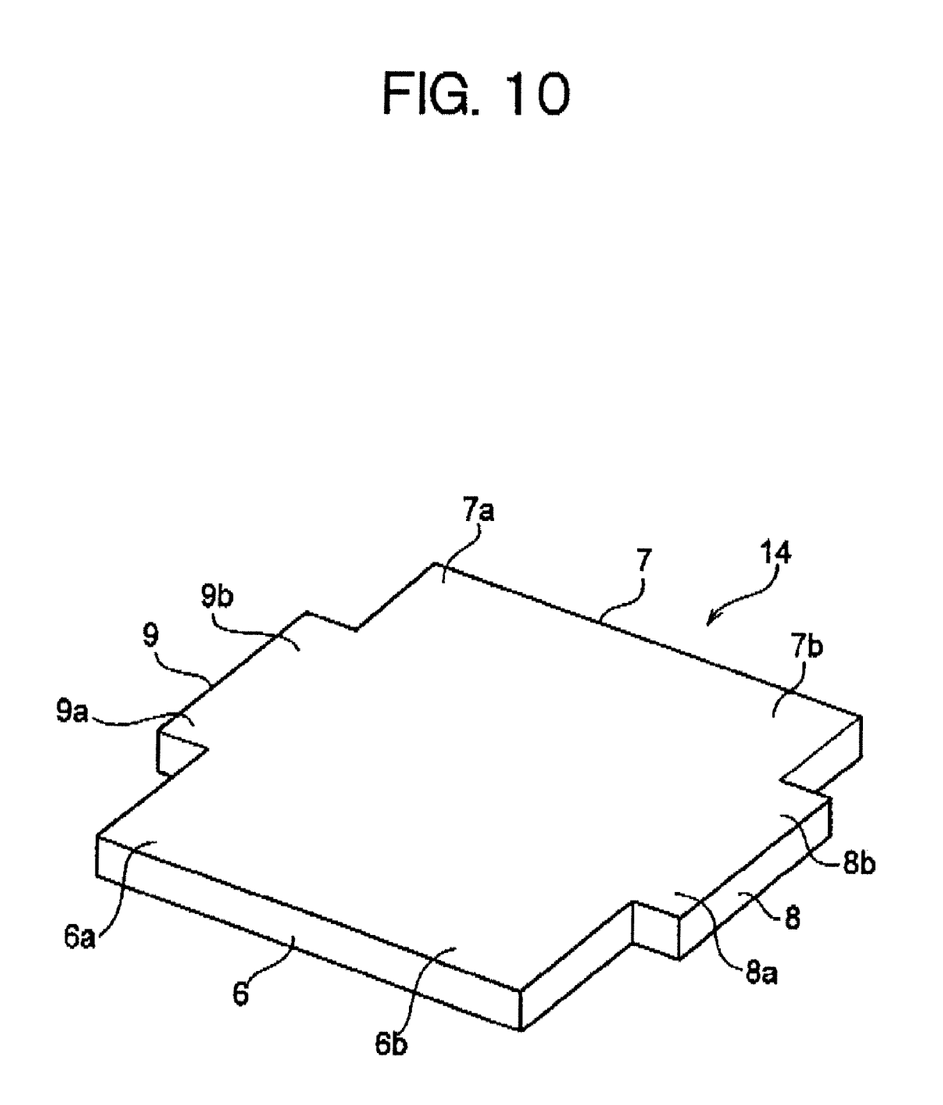
FIG. 10 is a perspective view showing a slide plate.

In FIG. 10, the pressing portion 15*a* of the first drive lever 15 presses an end portion 6*a* of the side 6 of the slide plate 14 and the pressing portion of the second drive lever 16 also presses the other end portion 6*b* of the side 6. Likewise, the pressing portion of the first drive lever 15 of the second pair presses one end portion 7*a* of the other side 7 of the slide plate 14 while the pressing portion of the second drive lever 16 presses the other end portion 7*b* of the other side 7.

According to the present invention, as shown in FIG. 7, the sub-levers 17, 18 are provided between the socket main body 11 and the bottom face of the socket cover 13. The sub-levers 17, 18 press one position or plural positions on other opposing two sides (see reference numerals 8, 9 in FIG. 10) of the slide plate 14 so as to lower the slide plate 14. The sub-levers 17, 18 are made of, for example, metal and each pair is provided on the other opposing two sides of the socket main body 11, whereby totally two pairs are arranged. The pair of the sub-levers 17, 18 is disposed in a substantially X-shape as seen from an arrow B in FIG. 7.

The shape and mounting structure of the sub-levers 17, 18 are substantially the same as those of the aforementioned drive levers 15, 16 and are formed into an elongated sheet shape extending in the width direction of the other opposing two sides of the socket main body 11. A pin (see reference numerals 23, 23 in FIG. 9) is inserted into the through hole bored in the proximal end portion and the sub-levers are mounted such that their tip-end portion sides are rotatable about the pins 23. Pressing portions projecting downward are formed on the bottom side face in the vicinity of the proximal end through which the pin 23 is passed to make contact with the top face of the slide plate 14 and as shown in FIG. 9, contact portions 17b, 18b which can make contact with the bottom face of the socket cover 13 are formed at the tip end portion on an opposite side to the pin 23.

With this state, in FIG. 10, the pressing portion of the first sub-lever 17 presses a position 8a on the other side 8 of the slide plate 14 while the pressing portion of the second sub-lever 18 presses other position 8b on the other side 8. Likewise, the pressing portion of the first sub-lever 17 of the second pair presses a position 9a on the other side 9 of the slide plate 14 while the pressing portion of the second sub-lever 18 presses other position 9b on the other side 9.

Then, the sub-levers 17, 18 are different from the aforementioned drive levers 15, 16 in that as shown in FIG. 7, the sub-levers 17, 18 are disposed at a central portion in the width direction of the socket main body 11 while the lengths of the sub-levers 17, 18 in the width direction of the other opposing two sides of the socket main body 11 are reduced, in order to press the central portion in which deformation of the other opposing two sides 8, 9 of the slide plate 14 shown in FIG. 10 becomes larger than both end portions. Further, because the length of the drive levers 15, 16 is set larger than that of the subs-levers 17, 18, the lever motion ratio exhibited by the drive levers 15, 16 to lower the slide plate 14 by an operation of down-movement of the socket cover 13 is set larger than the lever motion ratio exhibited by the sub-levers 17, 18 to lower the slide plate 14 by the down-movement operation of the socket cover 13.

Figure 9:
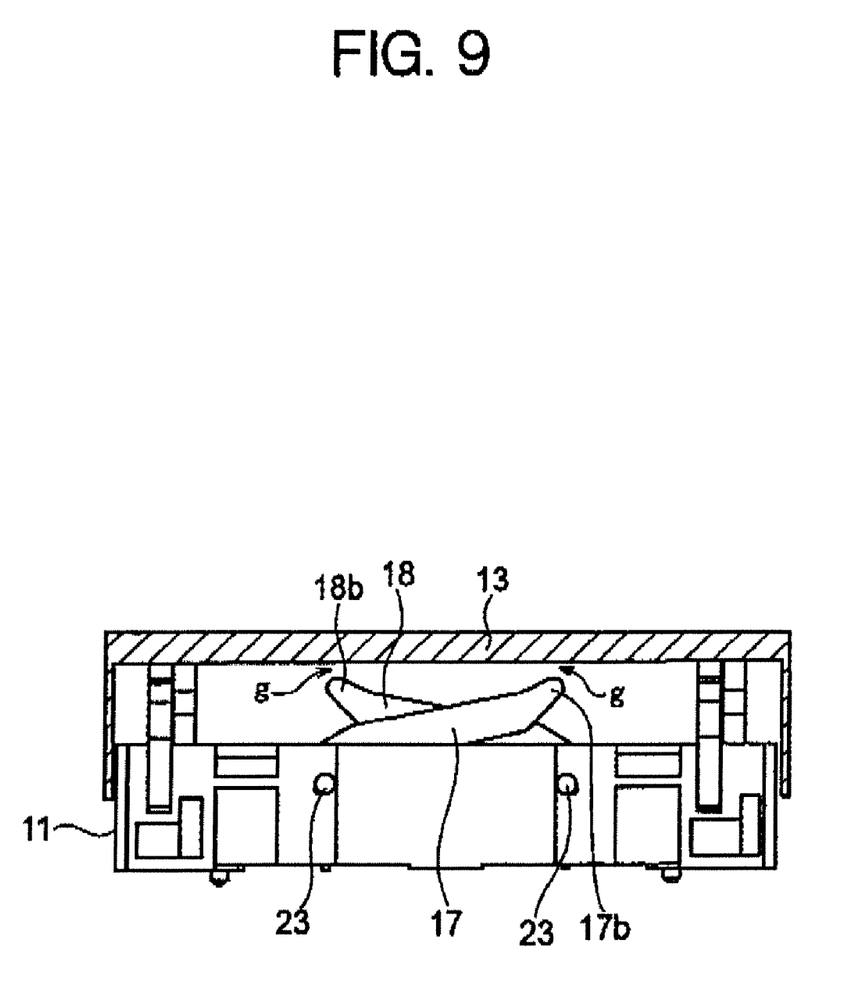
FIG. 9 is a partially sectional explanatory view taken from an arrow B in FIG. 7 showing a state in which the socket cover is attached.

Further, as shown in FIG. 9, the contact portions 17b, 18b at the tip end portions of the sub-levers 17, 18 are not in contact with the bottom face of the socket cover 13 at an initial condition but a gap g of a specified amount (for example, about 0.1 mm) is secured. As a result, after the drive levers 15, 16 press the opposing two sides 6, 7 of the slide plate 14 so that deformation of the slide plate 14 becomes more than a predetermined amount (for example, about 0.3 mm), the sub-levers 17, 18 press the other opposing two sides 8, 9 of the slide plate 14.

Next, the downward-movement operation of the slide plate 14 when the IC package 25 as an electric component is connected and fixed to such a socket for an electric component having the aforementioned structure will be described. First, the socket cover 13 is pressed down in FIG. 1. Then, as shown in FIG. 8, the two pairs of the drive levers 15, 16 (see FIG. 7), whose contact portions 15b, 16b at their tip end portions make contact with the bottom face of the socket cover 13, are pressed down so that they are rotated downward about the pins 22. At this time, as shown in FIG. 9, the contact portions 17b, 18b at the tip end portions of the two pairs of the sub-levers 17, 18 are not in contact with the bottom face of the socket cover 13 due to an existence of the gap g of the predetermined amount, so that the sub-levers 17, 18 are not yet rotated.

Then, the pressing portion 15a (see FIG. 1) of the first drive lever 15 of the first pair presses the end portion 6a of the side 6 of the slide plate 14 shown in FIG. 10 and the pressing portion of the second drive lever 16 presses the other end portion 6b of the same side 6. The pressing portion 15a of the first drive lever 15 of the second pair presses the end portion 7a of other side 7 of the slide plate 14 while the pressing portion of the second drive lever 16 presses the other end portion 7b of the other side 7. Consequently, the both end portions 6a, 6b; 7a, 7b (four corner portions) of the opposing two sides 6, 7 are pressed at the same time by rotations of the drive levers 15, 16 of the two pairs so that the whole slide plate 14 moves down equally in a state in which the entire surface is kept flat.

In this state, the contact pins 12 inserted into the number of pin holes 20 (see FIG. 2) bored in a substantially entire surface of the slide plate 14 are displaced equally, so that the contact portions 12c at the tip ends of the contact pins 12 are opened/closed substantially at the same time and consequently, are connected to all the solder balls 25b of the IC package 25 inserted through the opening portion 19 of the socket cover 13 and accommodated in the accommodating portion within the socket main body 11.

On the other hand, when the two pairs of the drive levers 15, 16 are rotated to press the slide plate 14 at the same time, if resistance between the slide plate 14 and the actuating portion 12d of each of the number of contact pins 12 due to sliding is large, the slide plate 14 is deformed such that the central portion between the opposing two sides 6 and 7 is curved upward as described about the prior art with reference to FIG. 12.

If the slide plate 14 is deformed such that the central portion of the slide plate 14 is curved upward, the two positions 8a, 8b; 9a, 9b of the other opposing two sides 8, 9 are floated relatively in FIG. 10, so that the gap g (see FIG. 9) between the contact portions 17b, 18b at the tip end portions of the two pairs of the sub-levers 17, 18 whose pressing portions make contact with the proximal portions of those positions 8a, 8b; 9a, 9b and the bottom face of the socket cover 13 is eliminated and consequently, the contact portions 17b, 18b of the two pairs of the sub-levers 17, 18 come into contact with the bottom face of the socket cover 13. Then, the two pairs of the sub-levers 17, 18 (see FIG. 7) are pushed downward, so that they are rotated downward about the pins 23.

At this time, in FIG. 10, the slide plate 14 is pressed through the both and portions 6a, 6b; 7a, 7b of the opposing two sides 6, 7 at the same time when the two pairs of the drive levers 15, 16 are rotated and when the two pairs of the sub-levers 17, 18 are rotated, the two positions 8a, 8b; 9a, 9b of the other opposing two sides 8, 9 are also pressed, so that the entire slide plate is lowered substantially equally by the press-down operation throughout the entire periphery. Consequently, it is able to reduce the amount of deformation of the slide plate 14 for substantially equalizing the amount of movement of the slide plate 14.

In such a condition, the contact pins 12 inserted into the number of pin holes 20 (see FIG. 2) bored in substantially the entire surface of the slide plate 14 are displaced equally, so that the contact portions 12c at the tip ends of the contact pins 12 are opened/closed substantially at the same time and then can be connected to all the solder balls 25b of the IC package 25 which is inserted through the opening portion 19 in the socket cover 13 and accommodated in the accommodating portion within the socket main body 11.

Although in the above description, the sub-levers 17, 18 serve for lowering the slide plate 14 by pressing the two positions on the other two opposing sides 8, 9 of the slide plate 14, the present invention is not limited to this example. When two positions of the other opposing two sides 8, 9 are pressed, any one of them may be pressed with a time lag. Alternatively, one position of the other opposing two sides 8, 9 of the slide plate 14, for example, a central axis position thereof may be pressed.

I claim:

1. A socket for an electric component comprising:
   a socket main body having an accommodating portion therein for accommodating an electric component;

a plurality of contact pins disposed in the socket main body and capable of coming in contact with or separating from each of connection terminals of the electric component;

a socket cover mounted on a top of the socket main body to be capable of performing an up and a down movement;

a slide plate vertically movably disposed in the socket main body to cause a displacement of the contact pins thereby permitting the contact pins to come into contact with or separate apart from each of the contact terminals of the electric component; and drive levers which are provided between the socket main body and a bottom face of the socket cover and configured to press both end portions on two opposing sides of the side plate, which oppose to each other, in response to the down movement of the socket cover to lower the side plate, wherein:

sub-levers are provided between the socket main body and the bottom face of the socket cover to press one or plural positions of other opposing two sides of the slide plate, which oppose to each other in a direction perpendicular to the two opposing sides pressed by the drive levers, to thereby lower the slide plate;

the sub-levers are disposed to press a central portion of the other opposing two sides of the side plate, which oppose to each other in the direction perpendicular to the two opposing sides pressed by the drive levers;

after the drive levers press both end portions on the opposing two sides of the side plate, which oppose to each other, and a deformation of the side plate becomes larger than a predetermined amount, the sub-levers are configured to apply a press to the other opposing two sides of the slide plate, which oppose to each other in the direction perpendicular to the two opposing sides pressed by the drive levers; and a lever motion ratio exhibited by the drive lever to lower the slide plate in response to the down movement of the socket cover is set larger than a lever motion ratio exhibited by the sub-lever to lower the slide plate in response to the down movement of the socket cover.

\* \* \* \* \*